United States Patent
Cappon

(10) Patent No.: US 7,292,087 B2
(45) Date of Patent: Nov. 6, 2007

(54) POWER SUPPLIES FOR DRIVING H-BRIDGES

(75) Inventor: Arthur M. Cappon, Oro Valley, AZ (US)

(73) Assignee: Apex Microtechnology Corporation, Tuscon, AZ (US)

(*) Notice: Subject to any disclaimer, the term of this patent is extended or adjusted under 35 U.S.C. 154(b) by 45 days.

(21) Appl. No.: 11/378,014

(22) Filed: Mar. 15, 2006

(65) Prior Publication Data

US 2006/0207498 A1 Sep. 21, 2006

Related U.S. Application Data

(60) Provisional application No. 60/661,754, filed on Mar. 15, 2005.

(51) Int. Cl.
*H03K 17/56* (2006.01)

(52) U.S. Cl. .................. 327/423; 327/110; 327/588

(58) Field of Classification Search .......... 327/110, 327/423, 588
See application file for complete search history.

(56) References Cited

U.S. PATENT DOCUMENTS 6,753,717 B2 * 6/2004 Inoue et al. ............... 327/423

* cited by examiner

*Primary Examiner*—Kenneth B. Wells
(74) *Attorney, Agent, or Firm*—Hayes Soloway P.C.

(57) ABSTRACT

An apparatus includes an integrated circuit that includes low side power supply circuitry that provides an output voltage for H-bridge circuitry. The low side power supply circuitry includes one transistor that provides one current to the output of the low side power supply circuitry in response to the output voltage of the low side power supply circuitry dropping below a quiescent level. The low side power supply circuitry also includes a second transistor that controls the conduction state of a third transistor, based at least in part, upon the first transistor providing the first current to the output of the low side power supply circuitry. The third transistor provides a second current to the output of the low side power supply circuitry.

22 Claims, 4 Drawing Sheets

POWER SUPPLIES FOR DRIVING H-BRIDGES

RELATED APPLICATION AND TECHNICAL FIELD

This application is related to the following U.S. application, of common assignee, from which priority is claimed, and the contents of which are incorporated herein in their entirety by reference: "High Voltage CMOS H-Bridge Gate Drive Power Supplies," U.S. Provisional Patent Application Ser. No. 60/661,754, filed Mar. 15, 2005.

This disclosure relates to power supplies for power amplifiers and, more particularly, to driving H-Bridge transistors at relatively high speed without components located off-chip.

BACKGROUND

Some types of power amplifiers such as pulse width modulated (PWM) amplifiers include a network of switching elements for controlling the directional flow of output current into a load. By outputting currents that alternate in direction, PWM amplifiers drive direct current (DC) and stepper motors for motion control applications in robotics, servomechanisms, printing devices, etc.

To provide currents with alternating flow directions, some PWM amplifiers implement four switching elements that provide two output currents with different flow directions. This circuitry, known as an "H-Bridge", may include various types of electronic components (e.g., relays, transistors, etc.) to provide the four switching elements.

To control H-Bridge operations, the PWM amplifier produces a pulse train that controls the functioning of the electronic switching components. For example, an external signal provided to a PWM amplifier may control the duty cycle of the pulse train. To initiate current flow in one direction, the duty cycle of the pulse train is increased to one pair of switching elements while the duty cycle of a complementary pair of switching elements is reduced.

Conventional PWM amplifiers implemented in monolithic integrated circuits (ICs) typically implement n-channel transistors and are typically unable to independently provide appropriate signal levels for controlling H-Bridge operations. To attain the appropriate signal levels, such PWM amplifiers use transistors implemented as source followers to "pull-up" signal levels. These pull-up transistors are typically coupled using relatively large capacity capacitors, known as bootstrap capacitors. Due to their large storage capacity, these bootstrap capacitors are typically located external to the IC. By implementing pull-up transistors and bootstrap capacitors, design complexity and production cost increases.

SUMMARY OF THE DISCLOSURE

In accordance with an aspect of the disclosure, an apparatus includes an integrated circuit that includes low side power supply circuitry that provides an output voltage for H-bridge circuitry. The low side power supply circuitry includes one transistor that provides one current to the output of the low side power supply circuitry in response to the output voltage of the low side power supply circuitry dropping below a quiescent level. The low side power supply circuitry also includes a second transistor that controls the conduction state of a third transistor, based at least in part, upon the first transistor providing the first current to the output of the low side power supply circuitry. The third transistor provides a second current to the output of the low side power supply circuitry.

In accordance with another aspect of the disclosure, an apparatus that includes an integrated circuit that includes high side power supply circuitry that provides an output voltage for H-bridge circuitry. The high side power supply circuitry includes a transistor configured to draw a first current from the output of the high side power supply circuitry in response to the output voltage of the high side power supply circuitry exceeding a quiescent level. The high side power supply also includes a second transistor that controls the conduction state of a third transistor, based at least in part, upon the first transistor drawing the first current from the output of the high side power supply circuitry. The third transistor draws a second current from the output of the high side power supply circuitry.

In accordance with still another aspect of the disclosure, an apparatus includes an integrated circuit that includes low side power supply circuitry that provides an output voltage for H-bridge circuitry. The low side power supply circuitry includes a transistor that provides a first current to the output of the low side power supply circuitry in response to the output voltage of the low side power supply circuitry dropping below a quiescent level. The low side power supply also includes a second transistor that controls the conduction state of a third transistor, based at least in part, upon the first transistor providing the first current to the output of the low side power supply circuitry. The third transistor provides a second current to the output of the low side power supply circuitry. The integrated circuit also includes high side power supply circuitry that provides an output voltage for the H-bridge circuitry. The high side power supply circuitry includes a fourth transistor that draws a first current from the output of the high side power supply circuitry in response to the output voltage of the high side power supply circuitry exceeding a quiescent level. The high side power supply circuitry also includes a fifth transistor that controls the conduction state of a sixth transistor based, at least in part, upon the fourth transistor drawing the first current from the output of the high side power supply circuitry. The sixth transistor draws a second current from the output of the high side power supply circuitry.

In accordance with still another aspect of the disclosure, a method includes a transistor, sending a first current to an output of a low side power supply circuitry in response to the output voltage of the low side power supply circuitry dropping below a quiescent level. The low side power supply circuitry provides an output voltage for H-bridge circuitry. The method also includes a second transistor, sending a second current to the output of the low side power supply circuitry, based at least in part, upon the first transistor sending the first current to the output of the low side power supply circuitry. A third transistor controls the conduction state of the second transistor.

Additional advantages and aspects of the present disclosure will become readily apparent to those skilled in the art from the following detailed description, wherein embodiments of the present invention are shown and described, simply by way of illustration of the best mode contemplated for practicing the present invention. As will be described, the present disclosure is capable of other and different embodiments, and its several details are susceptible of modification in various obvious respects, all without departing from the spirit of the present disclosure. Accordingly, the drawings and description are to be regarded as illustrative in nature, and not as limitative.

DETAILED DESCRIPTION OF THE EMBODIMENTS

Figure 1:
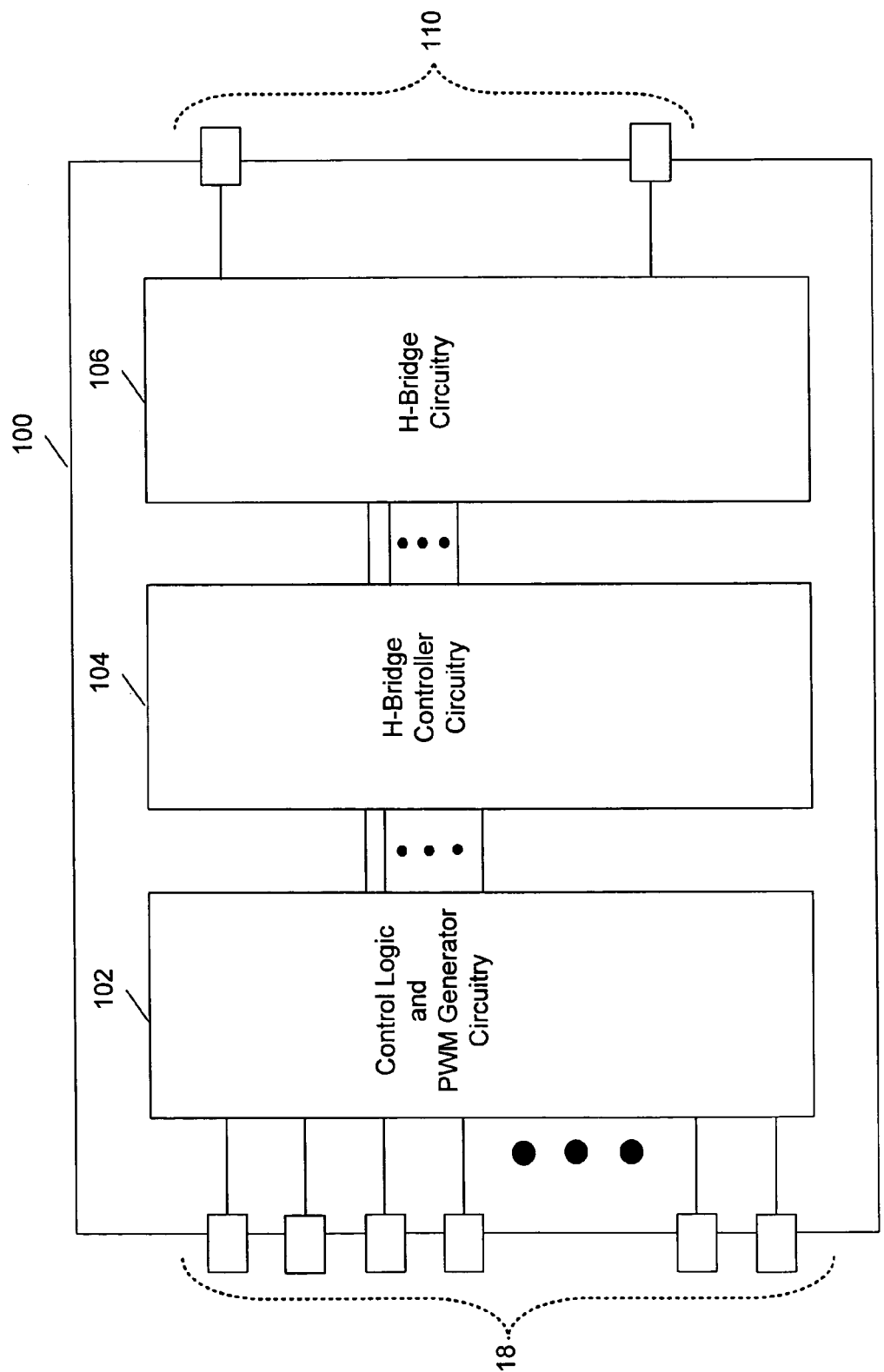
FIG. 1 is a block diagram representing a pulse width modulation amplifier.

FIG. 1 is a block diagram of a pulse width modulation (PWM) power amplifier 100 according to one embodiment. In this exemplary embodiment, PWM amplifier 100 includes Control Logic and PWM Generator Circuitry 102, H-bridge Controller Circuitry 104, and H-bridge Circuitry 106 that provides the output of the PWM amplifier.

PWM amplifier 100 may provide an output current that may alternate between two flow directions. For example, a current that flows in one direction to a load may be provided during one time period and another current that flows in an opposite direction may be provided during another time period. Control Logic and PWM Generator Circuitry 102 may be connected to a plurality of inputs 108 for receiving one or more input signals. For example, Control Logic and PWM Generator Circuitry 102 may receive one or more input signals, for defining output current limits, for timing, and/or for reference (e.g., a reference voltage signal) and/or protection (e.g., a short circuit alert signal).

Control Logic and PWM Generator Circuitry 102 may produce one or more control signals that may be provided to H-bridge Controller Circuitry 104. For example, a PWM signal may be provided by Control Logic and PWM Generator Circuitry 102 to H-bridge Controller Circuitry 104. Based on these control signals, H-bridge Controller Circuitry 104 may produce one or more signals for driving, e.g., switching elements included in H-bridge Circuitry 106. For example, signals for biasing bipolar (e.g., bipolar junction transistors, etc.) and/or field-effect switching elements (e.g., field-effect transistors, complementary metal oxide semiconductor (CMOS) transistors, etc.) may be provided by H-bridge Controller Circuitry 104. By providing appropriate driver signals to H-Bridge Circuitry 106, PWM amplifier 100 may provide current signals that may flow in alternate directions to one or more loads connected to outputs 110.

Figure 2:
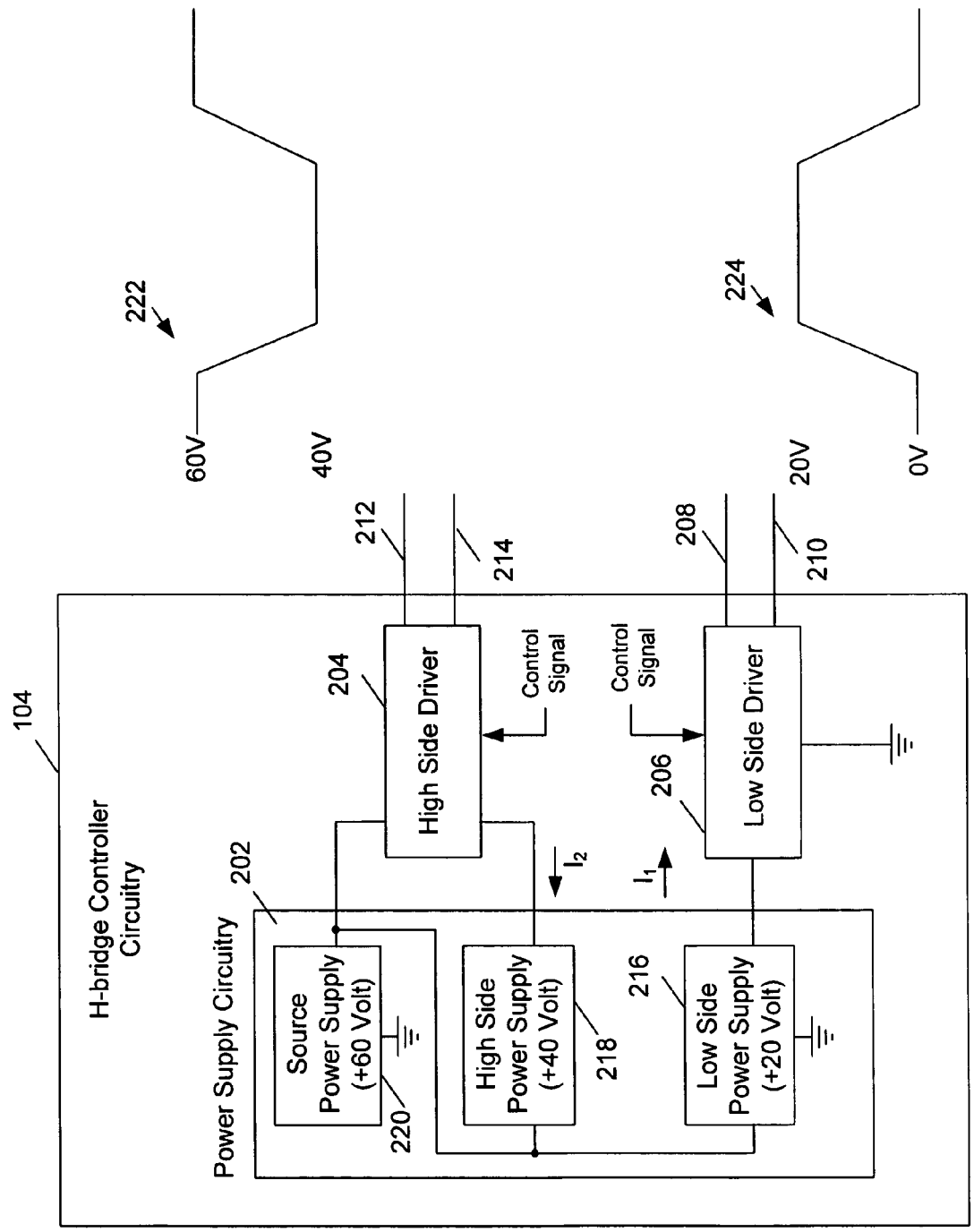
FIG. 2 is a block diagram representing a portion of the H-Bridge controller included in the PWM amplifier shown FIG. 1.

FIG. 2 is a detailed diagram of one embodiment of H-bridge Controller Circuitry 104 that implements complementary polarity metal-oxide semiconductor (MOS) transistors. H-bridge Controller Circuitry 104 may include power supply circuitry 202, a high side driver 204 and a low side driver 206. Low side driver 206 may deliver pulses to switching elements (e.g., N-channel power transistors) that may be located in H-bridge Circuitry 106. In one design, pulses ranging between 0 volt to +20 volts may be provided to the low side switching elements over conductors 208 and 210. Similarly, high side driver 204 may deliver pulses to complementary switching elements (e.g., P-channel transistors) that may be located in H-bridge stage 106. To control these switching elements, pulses ranging between +60 volts and +40 volts may be provided over conductors 212 and 214 to the respective switching elements.

To provide power, e.g., a low side power supply 216 may be connected to low side driver 206 and a high side power supply 218 may be connected to high side driver 204. Additionally, a source power supply 220 (e.g., +60 volts power supply) may be connected to high side driver 204 and power supplies 216 and 218. Low side power supply 216 may approximately provide a +20 volt level to low side driver 206 and current as indicated by label $I_1$. In a similar manner, high side power supply 218 may approximately provide a +40 volt level to high side driver 204. However, as illustrated with label $I_2$, power supply 218 may sink current. Additionally, power supply 218 may regulate a 20 volt level below the +60 volt level that may be provided by source power supply 220. By regulating the voltage provided to high side driver 204, the design may substantially prevent over-driving components in H-bridge Circuitry 106. For example, by regulating the voltage, switching elements (e.g., P-channel transistors) in H-Bridge Circuitry 106 may be substantially prevented from exceeding a maximum gate breakdown voltage rating.

For demonstrative purposes, exemplary pulse trains 222 and 224 may be respectively provided by high side driver 204 and low side driver 206 to the appropriate switching elements in H-Bridge stage 106. Pulse train 222 may be limited to voltage levels between +60 volts and +40 volts for controlling switching operations of e.g., P-channel power transistors, while pulse train 224 may provide approximately +20 volt pulses for controlling the switching operations of e.g., N-channel power transistors in H-bridge Circuitry 106.

Conventional designs that implement N-channel transistors may include relatively large energy storage capacitors (i.e., bootstrap capacitors) that may be located external to the IC package containing the PWM amplifier. These additional components may increase production cost and design complexity. By implementing H-bridge controller circuitry that includes complementary metal oxide semiconductor (CMOS) technology, external energy storage components may be eliminated and production cost and design complexity may be reduced. By implementing power supplies with reduced output capacitance and relatively high operating speeds, H-bridge Controller Circuitry 104 (e.g., high side driver 204, low side driver 206, etc.) may operate at high speeds without external bypass capacitors. Additionally, by increasing the transfer conductance (i.e., transconductance) of power supplies 218 and 216, transient driver currents may be compensated while reducing the need for external energy storage devices.

Figure 3:
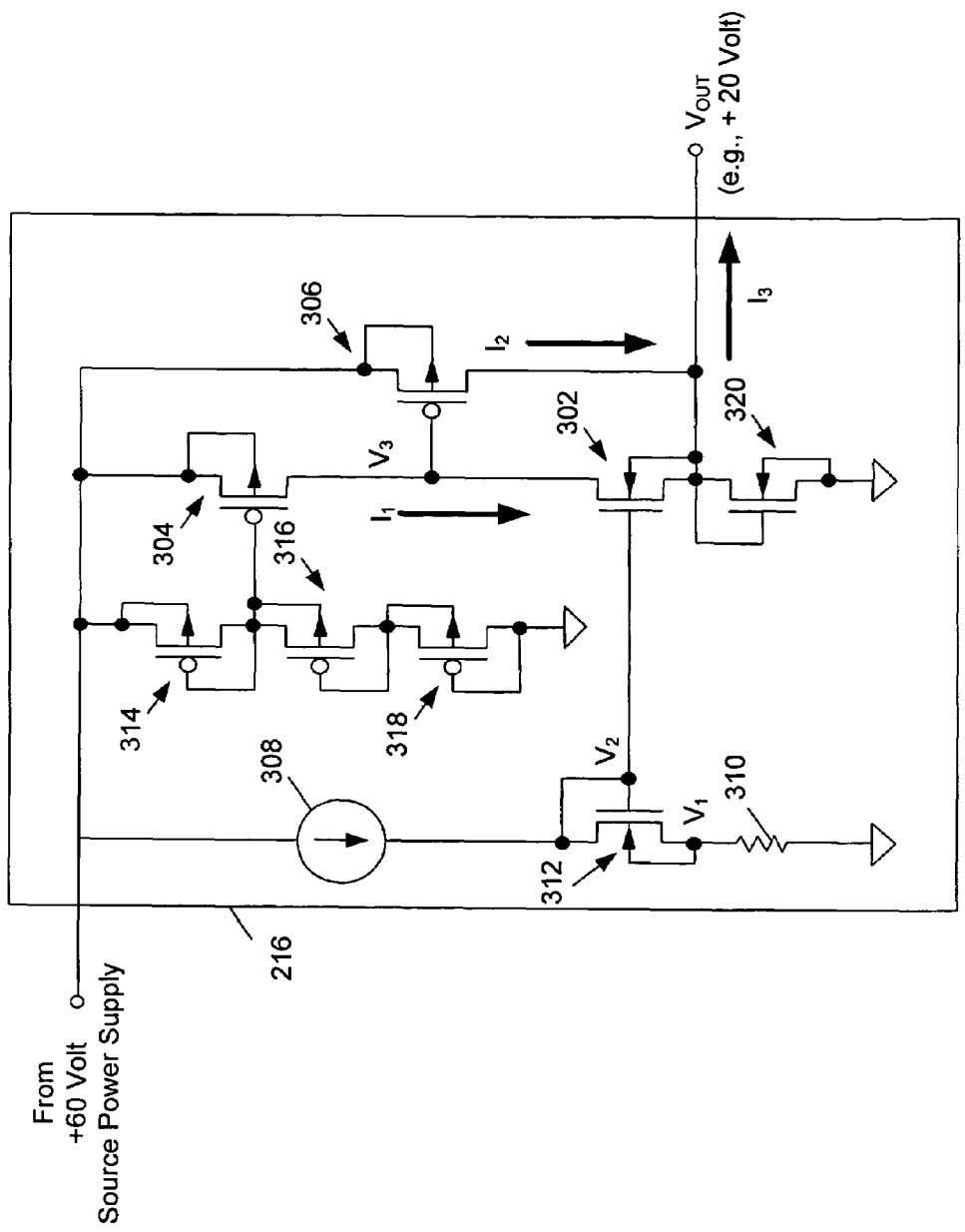
FIG. 3 is one exemplary circuit used to implement the low side driver power supply shown in FIG. 2.

FIG. 3 is one circuitry embodiment of low side driver power supply 216 that includes components for increasing transconductance of the supply. To increase the transconductance of power supply 216, three transistors 302, 304 and 306 may be included in the power supply design. As described in detail below, due to the interaction of transistors 302, 304 and 306, output impedance of power supply 216 may be decreased. By increasing the transconductance of power supply 36, additional decoupling by large energy storage devices (e.g., bypass capacitors) may not be needed.

To provide the +20 volts, power supply 216 may include a constant current source 308 that may be configured to develop a reference voltage $V_1$ across a resistor 310. Resistor 310 may be connected to the source of a field-effect transistor (FET) 312. Since the drain and gate of FET 312 are connected in this embodiment, the FET may function as an MOS diode for compensating threshold voltage variations in transistor 302. A voltage $V_2$ may be present on the gate of FET 302. Voltage $V_2$ may be approximately equivalent to voltage $V_1$ shifted by the gate-to-source voltage ($V_{gs}$) of FET 312. Voltage $V_2$ may substantially cancel the variations in $V_T$ and $G_M$ of FET 302.

A quiescent output voltage ($V_{out}$) of power supply 216 may be approximately equivalent to $V_1$. However, slight variations in $V_{out}$ may be introduced due to different operating conditions and/or parameters respectively associated with FET 312 and FET 302. In this embodiment, FET 302 may be configured as a common gate amplifier that may amplify the difference between voltage $V_{out}$ and $V_2$. To perform this function, FET 304 may operate as a load device for FET 302 and drive the gate of FET 306, which may be configured as a common source amplifier. In this exemplary embodiment, three FETs 314, 316 and 318 may provide a voltage divider for biasing the gate of FET 304. Power supply 216 may also include a FET 320 that may provide a relatively small bias current such that a small reverse output current or currents (e.g., due to leakage) may not substantially cause FET 302 to halt operations.

When a load variation may be experienced, FET 302 and/or FET 306 may conduct current to the output of the power supply. By providing this additional current, the output conductance of power supply 216 may be increased. In particular, when the current drawn by low side driver 206 increases, the output voltage of low side power supply 216 may be reduced below a quiescent level. For example, the output voltage may be reduced by an amount $\Delta V$. Based on this reduction, FET 302 conducts as indicated by current label $I_1$ and a voltage $V_3$ present at the gate of FET 306 may become a negative level. Due to $V_3$, FET 306 may be biased "on" and current may conduct from the source to the drain of FET 306 as indicated by current label $I_2$. Since FETs 302 and 306 may provide current (i.e., current $I_1$ and $I_2$) to the output of power supply 216, the output conductance of power supply 36 may increase due to the additional current contributions. As illustrated, currents $I_1$ and $I_2$ may combine to produce current $I_3$. Currents $I_1$ and $I_2$ may be provided with a relatively low output impedance since the transconductance of FET 306 may be amplified by the voltage gains of FET 302 and FET 304.

The increase in output conductance due to the contributions of FET 302 and 306 may be quantified from parameters associated with FETs 302, 304 and 306. As mentioned above, conductance may increase when the output voltage of power supply 216 is reduced by $\Delta V$, in which:

$$\Delta V = V_2 - V_{OUT}. \quad (1)$$

Using this voltage reduction $\Delta V$:

$$\Delta I_1 = \Delta V g m_{302}; \quad (2)$$

Where $gm_{302}$ may be the transconductance of FET 302;

$$\Delta V_3 = \Delta V g m_{302} R d_{304}; \quad (3)$$

Where $Rd_{304}$ may be the drain resistance of FET 304;

$$\Delta I_3 = \Delta I_1 + \Delta I_2; \quad (4)$$

$$G_{OUT} = \frac{\Delta I_3}{\Delta V_{OUT}}; \quad (5)$$

Where $G_{out}$ is the output conductance of power supply 216, and;

$$G_{OUT} = gm_{302}(1 + Rd_{304} gm_{306}). \quad (6)$$

Thus, as shown in equation (6), the output conductance of power supply 216 may be relatively large based on the transconductance of FET 302 and FET 306 and the drain resistance of FET 304. By implementing FETs 302, 304 and 306, external large capacitors may not be needed for handling relatively fast changing driver transient load currents. Additionally, this embodiment of power supply 216 may dissipate less power and may need less circuit board space compared to conventional n-channel designs.

Figure 4:
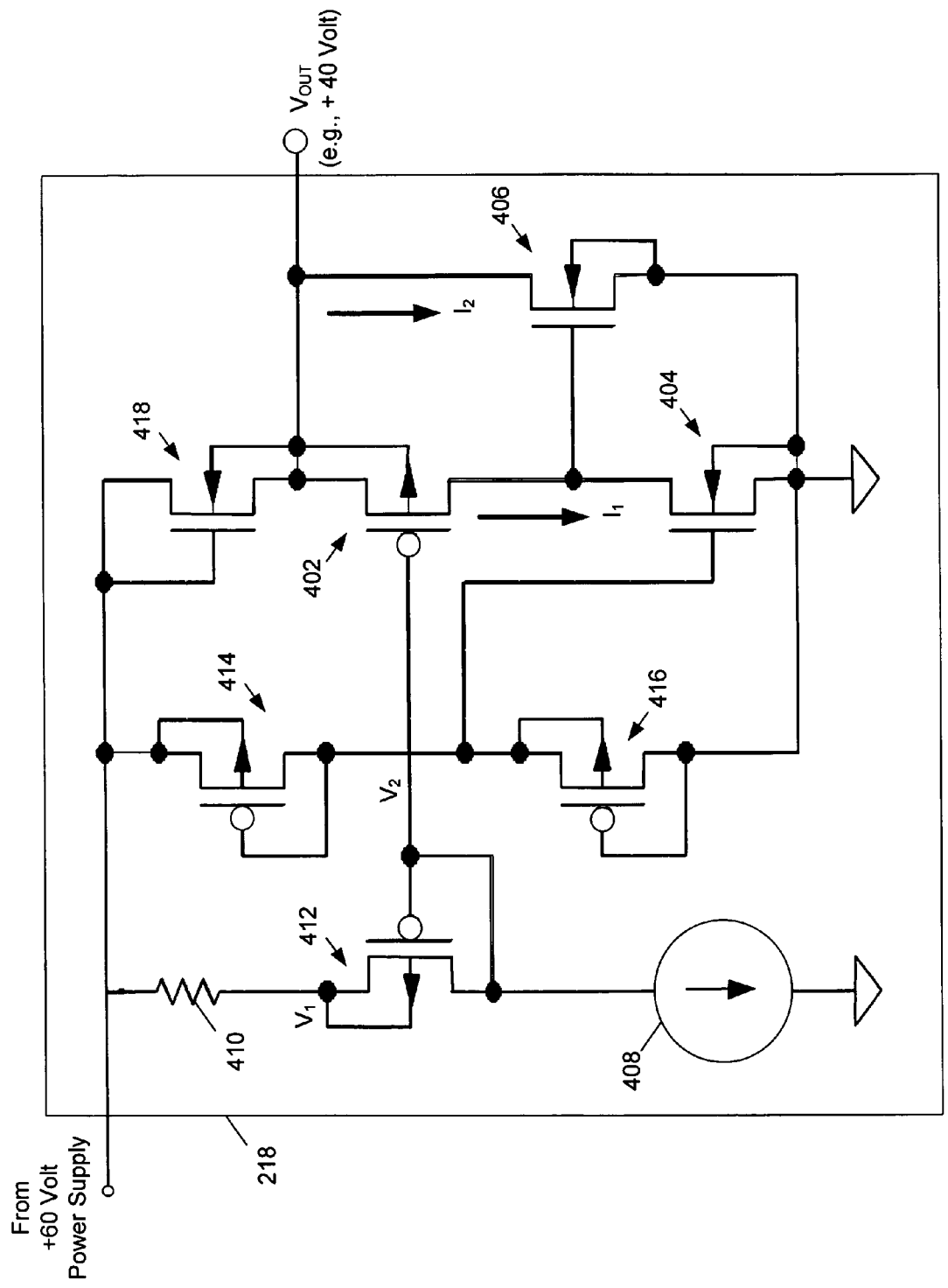
FIG. 4 is one exemplary circuit used to implement the high side driver power supply shown in FIG. 2.

FIG. 4 is one circuitry embodiment of high side power supply 218 that provides a voltage level to high side driver 204 of H-bridge Controller Circuitry 104. High side power supply 218 operates in a similar but complementary manner to low side power supply 216. For example, three FETs may be incorporated into power supply 218 to compensate for transient load conditions. Some of these transient load conditions may cause the output voltage (e.g., +40 volts) of power supply 218 to increase above a desired level.

In this embodiment, FETs 402, 404 and 406 may be included in power supply 218 to compensate for driver transient load conditions. This embodiment includes a constant current source 408 that may produce a voltage $V_1$ at a resistor 410 and a FET 412. Voltage $V_2$ may be related to voltage $V_1$ by the gate-to-source voltage ($V_{gs}$) of FET 412. As driver load conditions change, the output voltage may increase above a quiescent output level (e.g., +40 volts). By pulling the output $V_{out}$ to a higher voltage (i.e., above +40 volts), the voltage difference between $V_{out}$ and $V_2$ may bias FET 402 to conduct current as indicated by current label $I_1$. FET 404, which may function as a load device for FET 402, may be biased by the voltage divider formed by FETs 414 and 416. Due to the current $I_1$, FET 406 may also be biased to conduct current as indicated with current label $I_2$. By drawing currents $I_1$ and $I_2$, the output voltage of power supply 218 may be reduced toward the quiescent level (e.g., +40 volts) of the supply. Similar to the power supply 216, power supply 218 may include a FET 418 that may provide a standby current for FET 402. Power supply 218 may also provide an output conductance as defined by equation (6), however, with reversed polarities.

While the power supply embodiments shown in FIG. 3 and FIG. 4 (i.e., power supply 216 and power supply 218) incorporate field-effect transistors to compensate for transient load conditions, other types of switch devices may be implemented exclusively or in combination with field-effect transistors for output voltage compensation. For example, bipolar junction transistor (e.g., PNP BJTs, NPN BJTs, etc.) may be implemented in some power supply embodiments (with or without one or more FETs) for providing appropriate voltage levels to high and/or low side drivers that may drive H-bridge circuitry.

A number of implementations have been described. Nevertheless, it will be understood that various modifications may be made. Accordingly, other implementations are within the scope of the following claims.

What is claimed is:

1. An apparatus, comprising:
   an integrated circuit comprising:
      low side power supply circuitry configured to provide an output voltage for H-bridge circuitry, wherein the low side power supply circuitry includes:
         a first transistor configured to provide a first current to the output of the low side power supply circuitry in response to the output voltage of the low side power supply circuitry dropping below a quiescent level; and
         a second transistor configured to control the conduction state of a third transistor, based at least in part, upon the first transistor providing the first current to the output of the low side power supply circuitry, wherein the third transistor is configured to provide a second current to the output of the low side power supply circuitry.

2. The apparatus of claim 1, wherein the integrated circuit further comprises:
high side power supply circuitry configured to provide an output voltage for the H-bridge circuitry, wherein the high side power supply circuitry includes:
a fourth transistor configured to draw a first current from the output of the high side power supply circuitry in response to the output voltage of the high side power supply circuitry exceeding a quiescent level; and
a fifth transistor configured to control the conduction state of a sixth transistor, based at least in part, upon the fourth transistor drawing the first current from the output of the high side power supply circuitry, wherein the sixth transistor is configured to draw a second current from the output of the high side power supply circuitry.

3. The apparatus of claim 1, wherein the first transistor includes an n-channel field-effect transistor.

4. The apparatus of claim 2, wherein the fourth transistor includes a p-channel field-effect transistor.

5. The apparatus of claim 1, wherein the first transistor includes a bipolar transistor.

6. The apparatus of claim 2, wherein the fourth transistor includes a bipolar transistor.

7. The apparatus of claim 1, wherein the low side power supply circuitry is configured to provide a voltage signal to a low side driver.

8. The apparatus of claim 2, wherein the high side power supply circuitry is configured to provide a voltage signal to a high side driver.

9. The apparatus of claim 1, wherein the output conductance of the low side power supply circuitry is based on at least the transconductance of the first transistor and the transconductance of the third transistor.

10. The apparatus of claim 2, wherein the output conductance of the high side power supply circuitry is based on at least the transconductance of the fourth transistor and the transconductance of the sixth transistor.

11. An apparatus, comprising:
an integrated circuit comprising:
high side power supply circuitry configured to provide an output voltage for H-bridge circuitry, wherein the high side power supply circuitry includes:
a first transistor configured to draw a first current from the output of the high side power supply circuitry in response to the output voltage of the high side power supply circuitry exceeding a quiescent level; and
a second transistor configured to control the conduction state of a third transistor, based at least in part, upon the first transistor drawing the first current from the output of the high side power supply circuitry, wherein the third transistor is configured to draw a second current from the output of the high side power supply circuitry.

12. The apparatus of claim 11, wherein the integrated circuit further comprises:
low side power supply circuitry configured to provide an output voltage for the H-bridge circuitry, wherein the low side power supply circuitry includes:
a fourth transistor configured to provide a first current to the output of the low side power supply circuitry in response to the output voltage of the low side power supply circuitry dropping below a quiescent level; and
a fifth transistor configured to control the conduction state of a sixth transistor, based at least in part, upon the fourth transistor providing the first current to the output of the low side power supply circuitry, wherein the sixth transistor is configured to provide a second current to the output of the low side power supply circuitry.

13. The apparatus of claim 11, wherein the first transistor includes a p-channel field-effect transistor.

14. The apparatus of claim 12, wherein the fourth transistor includes an n-channel field-effect transistor.

15. An apparatus, comprising:
an integrated circuit comprising:
low side power supply circuitry configured to provide an output voltage for H-bridge circuitry, wherein the low side power supply circuitry includes:
a first transistor configured to provide a first current to the output of the low side power supply circuitry in response to the output voltage of the low side power supply circuitry dropping below a quiescent level, and
a second transistor configured to control the conduction state of a third transistor, based at least in part, upon the first transistor providing the first current to the output of the low side power supply circuitry, wherein the third transistor is configured to provide a second current to the output of the low side power supply circuitry; and
high side power supply circuitry configured to provide an output voltage for the H-bridge circuitry, wherein the high side power supply circuitry includes:
a fourth transistor configured to draw a first current from the output of the high side power supply circuitry in response to the output voltage of the high side power supply circuitry exceeding a quiescent level, and
a fifth transistor configured to control the conduction state of a sixth transistor based, at least in part, upon the fourth transistor drawing the first current from the output of the high side power supply circuitry, wherein the sixth transistor is configured to draw a second current from the output of the high side power supply circuitry.

16. The apparatus of claim 15, wherein the first transistor includes an n-channel field-effect transistor.

17. The apparatus of claim 15, wherein the fourth transistor includes a p-channel field-effect transistor.

18. The apparatus of claim 15, wherein the first transistor includes a bipolar transistor.

19. The apparatus of claim 15, wherein the fourth transistor includes a bipolar transistor.

20. The apparatus of claim 15, wherein the output conductance of the low side power supply circuitry is based on at least the sum of the transconductance of the first transistor and the transconductance of the third transistor.

21. A method, comprising:
a first transistor, sending a first current to an output of a low side power supply circuitry in response to the output voltage of the low side power supply circuitry dropping below a quiescent level, wherein the low side power supply circuitry is configured to provide an output voltage for H-bridge circuitry; and
a second transistor, sending a second current to the output of the low side power supply circuitry, based at least in part, upon the first transistor sending the first current to the output of the low side power supply circuitry, wherein a third transistor controls the conduction state of the second transistor.

22. The method of claim 21, further comprising:

a fourth transistor, drawing a first current from the output of a high side power supply circuitry in response to the output voltage of the high side power supply circuitry exceeding a quiescent level, wherein the high side power supply circuitry is configured to provide an output voltage for the H-bridge circuitry; and a fifth transistor, drawing a second current from the output of the high side power supply circuitry, based at least in part, upon the fourth transistor drawing the first current from the output of the high side power supply circuitry, wherein a sixth transistor controls the conduction state of the fifth transistor.

* * * * *